United States Patent
Dally et al.

(10) Patent No.: US 8,559,248 B2
(45) Date of Patent: Oct. 15, 2013

(54) CLAMPED BIT LINE READ CIRCUIT

(75) Inventors: William J. Dally, Stanford, CA (US); John W. Poulton, Chapel Hill, NC (US)

(73) Assignee: NVIDIA Corporation, Santa Clara, CA (US)

(*) Notice: Subject to any disclaimer, the term of this patent is extended or adjusted under 35 U.S.C. 154(b) by 92 days.

(21) Appl. No.: 13/159,982

(22) Filed: Jun. 14, 2011

(65) Prior Publication Data

US 2012/0320691 A1    Dec. 20, 2012

(51) Int. Cl.
*G11C 16/04* (2006.01)

(52) U.S. Cl.
USPC ............ 365/189.15; 365/189.06; 365/189.09; 365/154; 365/189.16

(58) Field of Classification Search
USPC .................. 365/189.06, 189.09, 154, 189.15, 365/185.16
See application file for complete search history.

(56) References Cited

U.S. PATENT DOCUMENTS

| | | | | |
|---|---|---|---|---|
| 6,236,598 | B1 * | 5/2001 | Chou | 365/189.06 |
| 7,020,041 | B2 * | 3/2006 | Somasekhar et al. | 365/229 |
| 7,532,522 | B2 * | 5/2009 | Hsu et al. | 365/189.09 |
| 7,672,182 | B2 * | 3/2010 | Park et al. | 365/203 |
| 7,701,783 | B2 * | 4/2010 | Yamagami | 365/189.06 |

OTHER PUBLICATIONS

Seevinck, et al. "Current-Mode Techniques for High-Speed VLSI Circuits with Application to Current Sense Amplifier for CMOS SRAM's" IEEE Journal of Solid-State Circuits, vol. 26, No. 4 dtd Apr. 1991 pp. 525-536.
Sharifkhani, et al. "A Compact Hybrid Current/Voltage Sense Amplifier with Offset Cancellation for High-Speed SRAMs" IEEE Transactions on Very Large Scale Integration (VLSI) Systems, vol., 19, No. 5 dtd May 2011 pp. 883-894.
Pilo, et al. A 64Mb SRAM in 32nm High-k Metal-Gate SOI Technology with 0.7V Operation Enabled by Stability, Write-Ability and Read-Ability Enhancements ISSCC 2011/Session 14/ High-Performance Embedded Memory/14.1 pp. 254-256.

* cited by examiner

*Primary Examiner* — Connie Yoha
(74) *Attorney, Agent, or Firm* — Zilka-Kotab, PC

(57) ABSTRACT

One embodiment of the present invention sets forth a clamping circuit that is used to maintain a bit line of a storage cell in a memory array at a nearly constant clamp voltage. During read operations the bit line is pulled high or low from the clamp voltage by the storage cell and a change in current on the bit line is converted by the clamping circuit to produce an amplified voltage that may be sampled to read a value stored in the storage cell. The clamping circuit maintains the nearly constant clamp voltage on the bit line. Clamping the bit line to the nearly constant clamp voltage reduces the occurrence of read disturb faults. Additionally, the clamping circuit functions with a variety of storage cells and does not require that the bit lines be precharged prior to each read operation.

21 Claims, 14 Drawing Sheets

PRIOR ART

PRIOR ART

US 8,559,248 B2

CLAMPED BIT LINE READ CIRCUIT

BACKGROUND OF THE INVENTION

1. Field of the Invention

The present invention generally relates to digital memory circuits and more specifically to a clamped bit line read circuit.

2. Description of the Related Art

As the process technology enables the fabrication of transistors having smaller dimensions and the density of semiconductor memory devices increases. However, as the process technology shrinks, the reliability of conventional storage cells is reduced due to variations in the process and low operating voltages.

FIG. 1A illustrates a conventional 6 transistor storage cell 100 configured in a memory array, according to the prior art. The 6 transistor storage cell 100 is a conventional static random access memory (SRAM) cell that includes four NMOS transistors and two PMOS transistors. A word line 102, coupled to the gates of two pass transistors may be enabled to read from or write to a storage circuit formed by cross-coupled inverters. The word line 102 is coupled to many 6 transistor storage cells 100 in a row, but only one row is accessed during a read or write operation. When the word line 102 is asserted (driven to a high voltage or TRUE) to perform a read operation, the bit stored in the storage circuit is transferred to bit line H 105 and the complement is transferred to bit line L 106. A sense amplifier 108 amplifies the difference in voltage levels between bit line H 105 and bit line L 106 and the amplified difference, output 109 is sampled to read the bit stored in the 6 transistor storage cell 100.

One problem that results from the low operating voltages is that read operations may be unstable when the transistor threshold voltage is too large compared with the operating voltage, leaving little margin for switching. A read disturb fault occurs when the word line 102 is asserted to read a first 6 transistor storage cell 100. The first 6 transistor storage cell 100 or any other 6 transistor storage cell in the row may be inadvertently written when the first 6 transistor storage cell 100 is read. Therefore, the value stored in the second 6 transistor storage cell 100 may be changed (disturbed) during the read of the first 6 transistor storage cell 100. The read disturb fault results from a transistor mismatch caused by the size of the access transistors coupled to bit line H 105 and bit line L 106 is increased to ensure that the 6 transistor storage cell 100 can be reliably written.

FIG. 1B illustrates a conventional 8 transistor storage cell configured in a memory array, according to the prior art. The 8 transistor storage cell 110 is also conventional SRAM cell. The 8 transistor storage cell 110 includes six NMOS transistors and two PMOS transistors and is robust compared with the 6 transistor storage cell 100. Two additional NMOS transistors are used in the 8 transistor storage cell 110 to prevent read disturb faults.

Separate word lines are provided for reading and writing to avoid read disturb faults. A word line write 112 is coupled to the gates of two pass transistors. When a write operation is performed the word line write 112 is asserted and the value to be written is driven on bit line write H 115 and the complement of the value is driven on bit line write L 116. When a read operation is performed to read from a first 8 transistor storage cell 110, the word line read 114 is asserted and the value stored in the 8 transistor storage cell 110 is output to the bit line read 120. The additional transistors in the read path, prevent the transfer of any signal to the storage circuits of the 8 transistor storage cells 110. Therefore, read disturb faults are prevented.

FIG. 1C illustrates a conventional method of performing a read operation for the 6 or the 8 transistor storage cells 100 and 110 shown in FIGS. 1A and 1B, respectively, according to the prior art. At step 150 the bit lines 105 and 106 or bit lines 115 and 116 are precharged to a high voltage level prior to a read operation. At step 155 the precharge is disabled. At step 160 the word line 104 or 114 is asserted to perform the read operation. At step 165, the method determines if a sufficient differential voltage to be sensed, e.g., at least 100 mV, has developed on the bit line(s). When the 6 transistor storage cell 100 is used, either the bit line H 105 or the bit line L 106 will be pulled down towards a low voltage level while the complementary bit line remains at the high voltage level resulting from the precharge. When the 8 transistor storage cell 110 is used, the bit line read 120 will be pulled down towards a low voltage level or will remain at the high voltage level resulting from the precharge. When the bit lines have developed sufficient differential voltage, at step 170 the word line is negated and at step 175 the voltage difference between the bit line H 105 or the bit line L 106 is sensed by the sense amplifier 108 to generate the output 109. When the 8 transistor storage cell 110 is used, at step 170 the bit line read 120 is sensed to read the value.

Accordingly, what is needed in the art are new circuits that, like the 8 transistor storage cell 110, reduce the occurrence of read disturb faults. Additionally, such new circuits should function with a variety of storage cells, e.g., 6 and 8 transistor storage cells, and should not require that the bit lines be precharged prior to each read operation.

SUMMARY OF THE INVENTION

One embodiment of the present invention sets forth a clamping circuit that is used to maintain a bit line of a storage cell in a memory array at a nearly constant clamp voltage. During read operations the bit line is pulled up or down from the clamp voltage and the change in current is converted by the clamping circuit to produce an amplified voltage that may be sampled to read a stored value. Clamping the bit line to the nearly constant clamp voltage reduces the occurrence of read disturb faults. Additionally, the clamping circuit functions with a variety of storage cells.

Various embodiments of the invention comprise a memory array. The memory array comprises a bit line, a storage cell that coupled to the bit line and is read when a word line is enabled, and a clamping circuit coupled to the bit line and configured to hold the bit line at a nearly constant clamp voltage during a read operation.

Various embodiments of the invention comprise a method of reading a bit line of a memory array. The method includes enabling a word line to perform a read operation of a storage cell, amplifying a change in current developed on a bit line that is coupled to the storage cell while the word line is enabled and while the bit line is held to a nearly constant clamp voltage by a clamping circuit, and sampling an amplified voltage generated by the clamping circuit.

One advantage of the disclosed circuit is that the bit lines do not need to be precharged prior to each read operation. Therefore, the dynamic power dissipation is reduced significantly compared with memory arrays using storage cells that need to be precharged prior to each read operation. Static power is also significantly reduced because there is less leakage across the transfer devices that are coupled to the bit lines. The clamping circuit reduces read faults so that sizing dependencies between the different transistors of the storage cells may be relaxed. Therefore, read operations are robust, even when the characteristics of the transistors vary due to the fabrication process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1A:
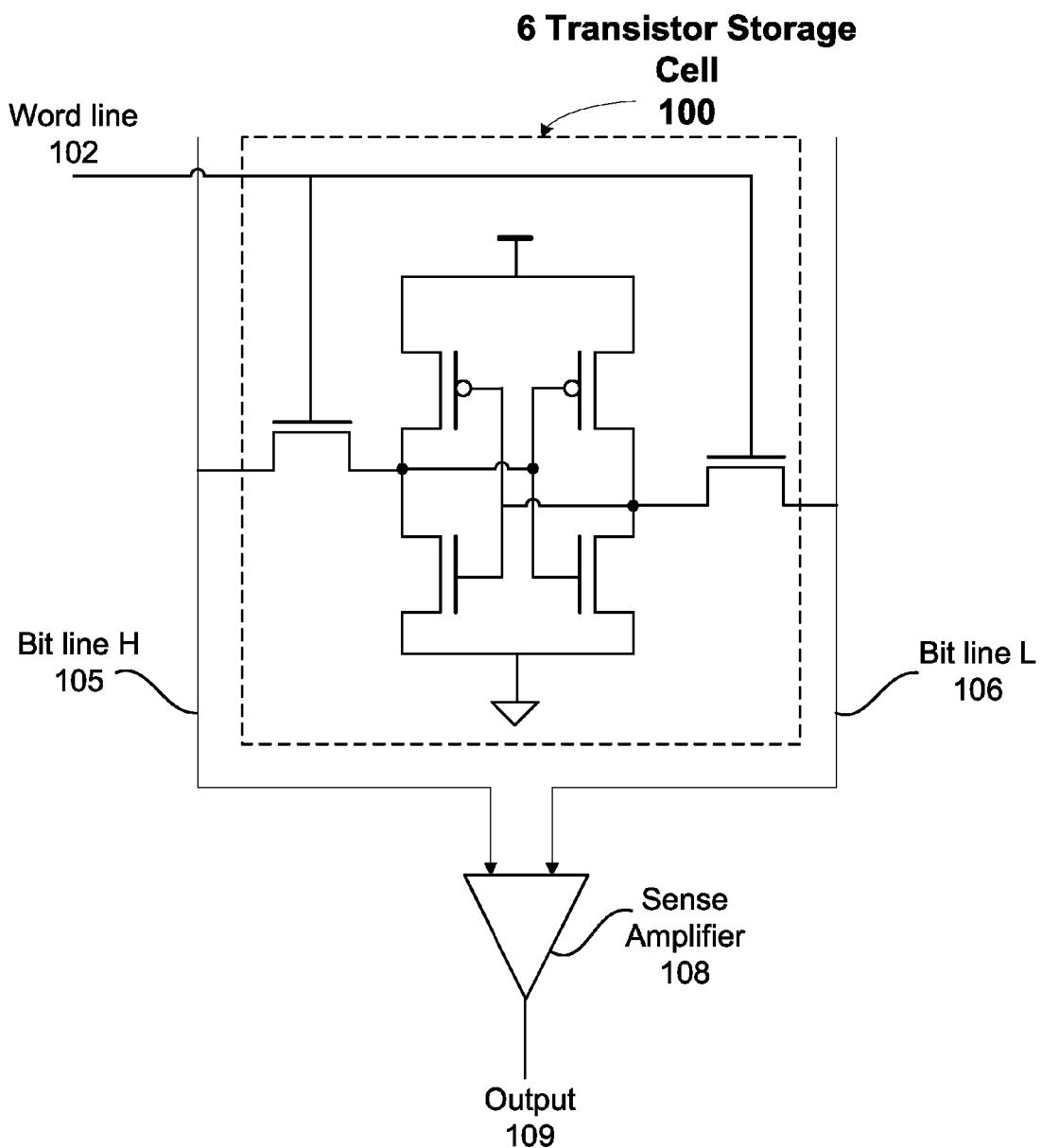
FIG. 1A illustrates a conventional 6 transistor storage cell configured in a memory array, according to the prior art.
Figure 1B:
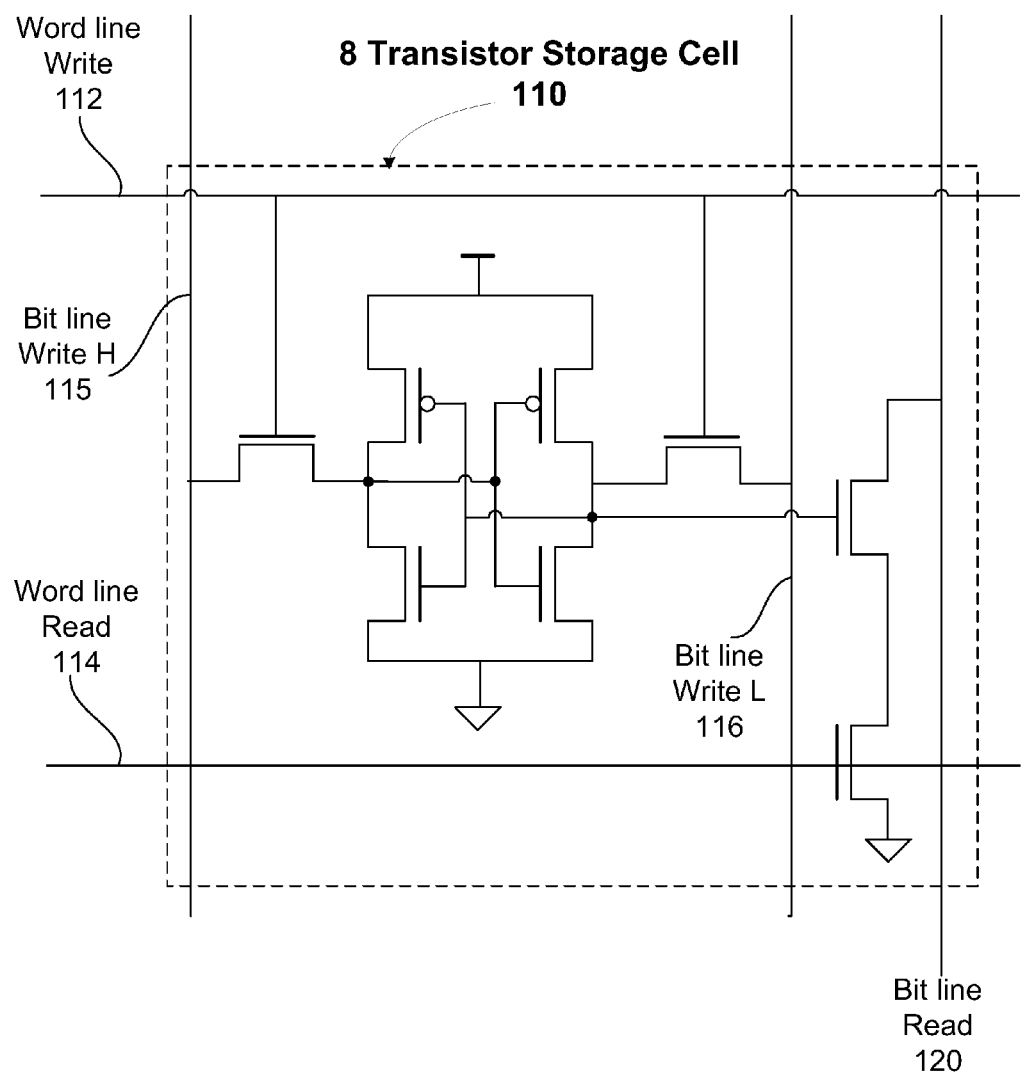
FIG. 1B illustrates a conventional 8 transistor storage cell configured in a memory array, according to the prior art.
Figure 1C:
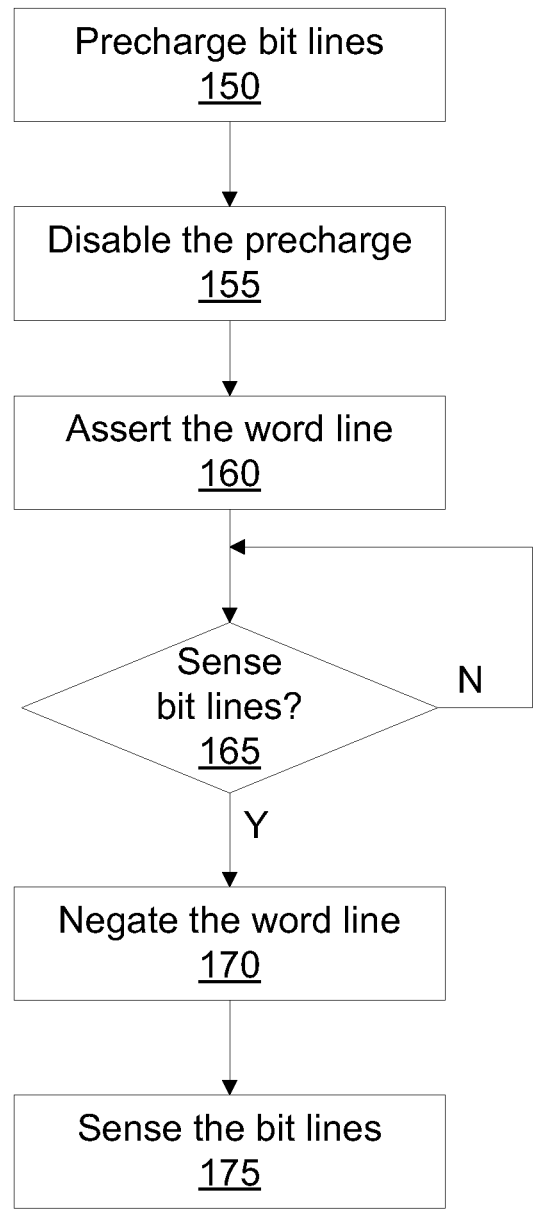
FIG. 1C illustrates a conventional method of performing a read operation for the 6 or the 8 transistor storage cells shown in FIGS. 1A and 1B, respectively, according to the prior art.
Figure 2A:
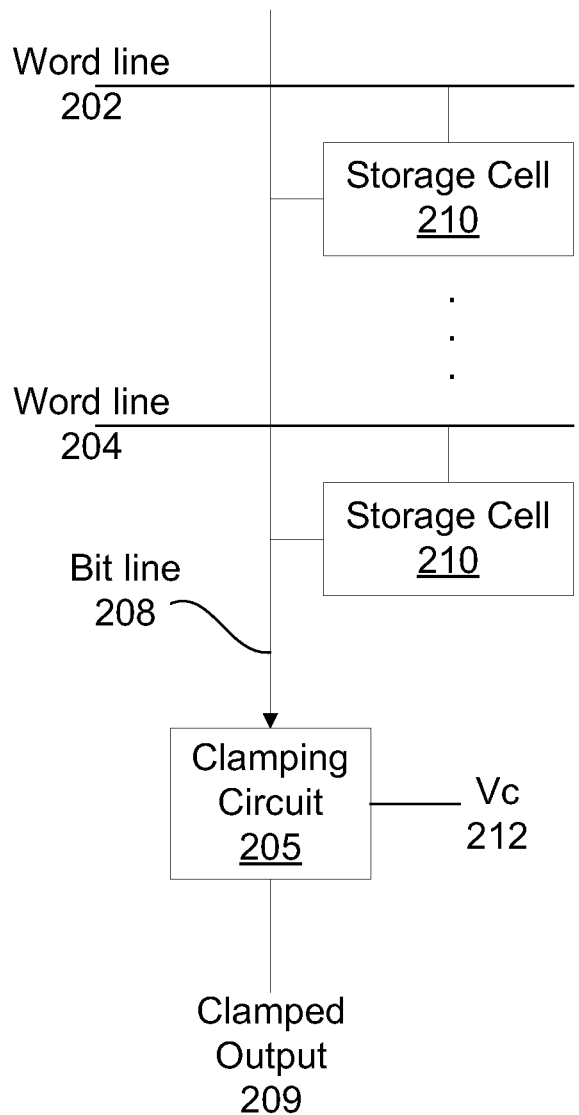
FIG. 2A illustrates a diagram of a storage cells of a memory array that are coupled to a bit line read clamping circuit, according to one embodiment of the invention.
Figure 3A:
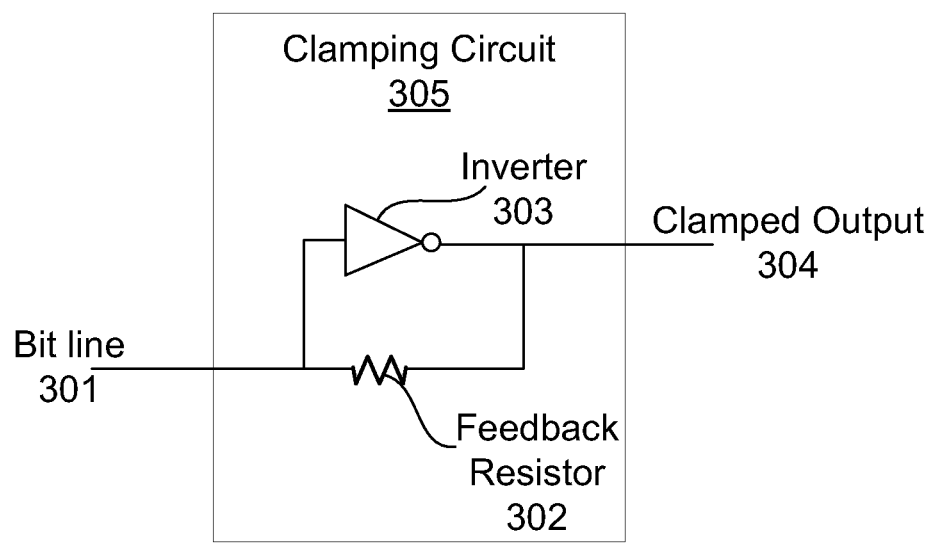
FIG. 3A illustrates a bit line read clamping circuit using an inverter with feedback, according to one embodiment of the invention.
Figure 3B:
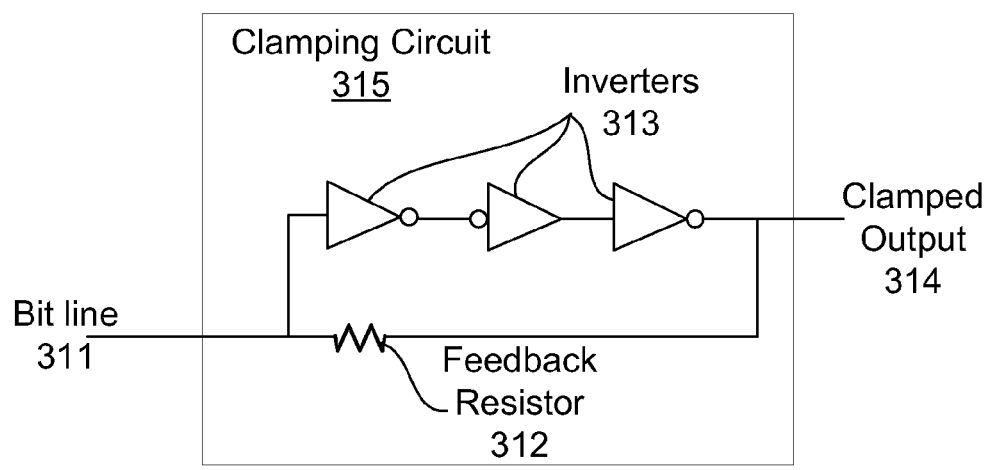
FIG. 3B illustrates a bit line read clamping circuit using multiple inverters with feedback, according to one embodiment of the invention.

FIG. 2A illustrates a diagram of a storage cells of a memory array that are coupled to a bit line read clamping circuit 200, according to one embodiment of the invention. A clamping circuit 205 maintains the bit line 208 at a nearly constant clamp voltage of Vc 212. When at least one inverter is used in the feedback path (as shown in FIGS. 3A and 3B), the nearly constant clamp voltage of Vc 212 is $V_{inv}$, the threshold voltage of the inverter, the voltage at which the input and output voltage of the inverter are equal. In one embodiment, the nearly constant clamp voltage equals half of the supply voltage (VCC) provided to the clamping circuit 200. When a read operation is performed, i.e., the word line 204 or 202 is enabled, the current flowing through the bit line 208 is converted by resistance in the feedback path to generate voltage across the inverter. An amplified voltage is produced at the clamped output 209 that corresponds to the value read from the selected storage cell 210 via the bit line 208. The bit line 208 is held at the constant clamp voltage, Vc 212 and the bit line 208 deviates from Vc 212 by a small amount, typically less than 50 mV (millivolts) when a storage cell 210 is read. The bit line 208 is clamped to a nearly constant clamp voltage during the read operation and no precharge is needed prior to the read operation.

Figure 2B:
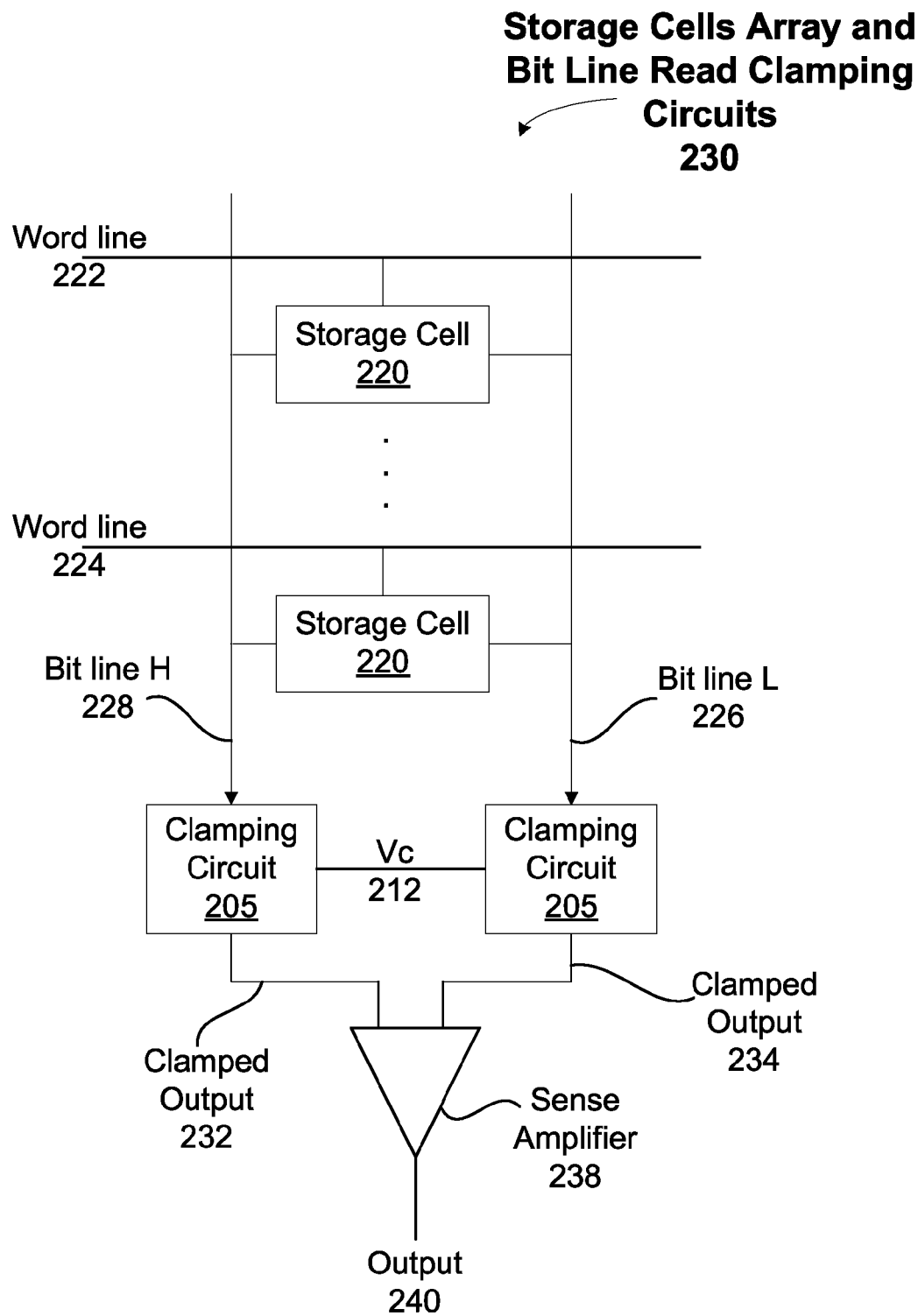
FIG. 2B illustrates another diagram of a storage cells of a memory array that are coupled to bit line read clamping circuits, according to one embodiment of the invention.

FIG. 2B illustrates another diagram of a storage cells 220 of a memory array that are coupled to bit line read clamping circuits 230, according to one embodiment of the invention. Rather than using a single bit line 208, the memory array shown in FIG. 2B uses differential or complementary bit lines, bit line H 228 and bit line L 226. A clamping circuit 205 is coupled to bit line H 228 and to bit line L 226 to generate a clamped output 232 and a clamped output 234, respectively. A sense amplifier 238 samples the clamped output 232 and 234 to generate the output 240. When a read operation is performed, i.e., the word line 224 or 222 is enabled, the current flowing through each of the bit lines, bit line H 228 and bit line L 226, is converted into amplified voltages by the respective clamping circuits 205. The sense amplifier 238 can be gated off when not in use to save power.

FIG. 3A illustrates an embodiment of the bit line read clamping circuit 305 using an inverter 303 with feedback, according to one embodiment of the invention. The inverter 303 attempts to hold the bit line 301 at the clamp voltage Vc 212 that equals $V_{inv}$. The feedback resistance, shown as feedback resistor 302, converts the current passing through the bit line 301 to a voltage across the inverter 303 to generate the clamped output 304 during read operations. Because CMOS inverters have relatively low gain (typically in the range of 5-10), the bit line 301 will swing (or vary from Vc) by a small amount. For example, a 20-40 mV swing on the bit line 301 may produce a 200 mV swing at the output of the inverter 303. As the gain increases, the swing also increases. The inverter 303 can be sized with a long gate to increase gain at the expense of speed. Typically, reducing speed in favor of increase the gain is a worthwhile tradeoff when the clamping circuit 305 is used in a memory array. In one embodiment, the feedback resistor 302 is implemented as a CMOS pass gate or a CMOS transmission gate that can be disabled when not in use.

FIG. 3B illustrates a bit line read clamping circuit 315 using multiple inverters 313 with feedback, according to one embodiment of the invention. Each of the inverters 303 attempts to hold the bit line 311 at the clamp voltage Vc 212 that equals $V_{inv}$. The feedback resistance, shown as feedback resistor 302, converts the current passing through the bit line 311 to a voltage across the inverters 313 to generate the clamped output 314 during read operations. In one embodiment, the feedback resistor 312 is implemented as a CMOS pass gate or a CMOS transmission gate that can be disabled when not in use.

The gain of the inverters 313 may be larger than the inverter 303, and hence the voltage swing of the bit line may be smaller when several inverters, such as inverters 313, are configured in series as shown in FIG. 3B. The capacitance of the bit line 311 needs to be large enough to provide phase margin so that the clamped output 314 does not oscillate.

Note that when the clamping circuit 305 or 315 is used for complementary bit lines, as shown in FIG. 2B, the offsets in the inverter threshold voltage $V_{inv}$ between the inverters for the different bit lines do appear at the clamped outputs 232 and 234. Assuming that the gain of the inverter is –G, then when the portion of the amplified voltage at the clamped outputs 232 and 234 resulting from the gain of the inverter is $i_bR$ higher than the input, where $i_b$ is the current through the bit line and R is the resistance of the feedback resistor. The difference of $i_bR$ is split between the input dropping by $i_bR/(G+1)$ and the output going up by $Gi_bR/(G+1)$, so the amplified voltage at the clamped outputs 232 and 234, including the gain contribution) is $V_{inv}+i_bR-i_bR/(G+1)$ which is equal to $V_{inv}+Gi_bR/(G+1)$. In the first form, the final term, $i_bR/(G+1)$ is due to finite gain and goes to zero as G goes to infinity. However the offsets in the inverter threshold voltage $V_{inv}$ between the inverters for the different bit lines are small compared with the larger sense voltage, $i_bR$, even when G is a typical value of 5-10.

The clamping circuits 205, 305, and 315 are advantageous in several different ways. First, by clamping the bit lines at a nearly constant value, read disturb faults are minimized. The bits lines simply are not pulled so high or so low during a read operation that a memory cell 210 is overwritten. Therefore, the transfer devices (transistors coupled to the bit lines) in the memory cell 210 or 220 may be sized aggressively (i.e., larger) to enable write operations. Because read faults are avoided when the clamping circuits 205, 305, and 315 are used, the 6 transistor storage cell 100 with small devices in technologies (like 20 nm) may be used within the memory cell 210 or 220. In contrast, a memory array that does not use the clamping circuits 205, 305, or 315 may not be able to use the 6 transistor storage cell 100 because of the higher voltage swings during read operations.

A second advantage is that the clamping circuits 205, 305, and 315 are tolerant of voltage offsets. Voltage offsets in the inverters 303 and 313 simply result in a different steady-state voltage for the bit line 301 or 311, respectively. Any voltage offset is implicitly subtracted from the sensed voltage at the clamped output 304 or 314 by the feedback loop through the feedback resistor 302 or 312, respectively.

A third advantage is that the bit lines of a memory array that includes the clamping circuits 205, 305, and 315 do not need to be precharged before each read operation. The read operation is completely combinational—although a clocked sense amplifier 238 may be used to sample the clamped output(s). Also leakage of the storage cell 210 or 220 is reduced because the bit lines are clamped to a mid-range voltage rather than being pulled down from the precharge voltage level (Vdd).

A fourth advantage is that the clamping circuits 205, 305, and 315 consume a low amount of dynamic power—the voltage on the bit line(s) does not typically deviate from Vc 212 by more than 50 mV. Typically, the voltage on the bit lines deviates from Vc 212 by much less than 50 mV.

Figure 3C:
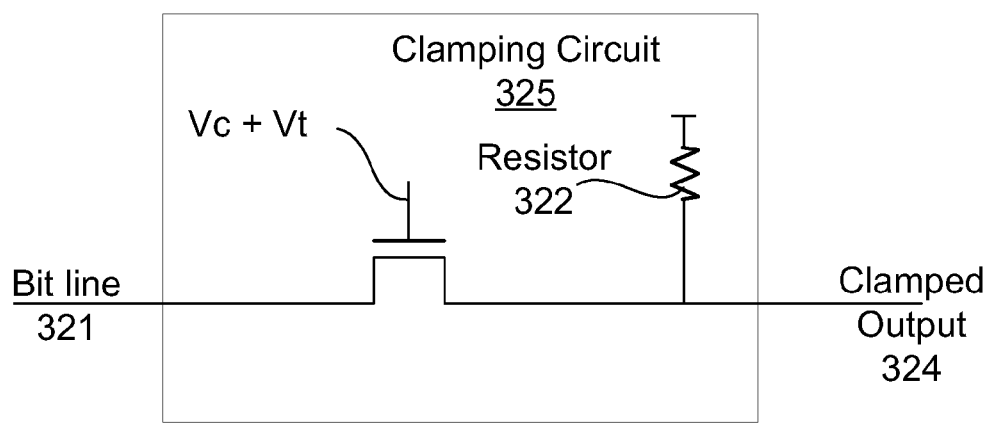
FIG. 3C illustrates a bit line read clamping circuit using a cascode amplifier, according to one embodiment of the invention.

FIG. 3C illustrates a bit line read clamping circuit 325 using a cascode amplifier, according to one embodiment of the invention. A simple single-ended clamp can be realized using a single-transistor cascode amplifier. When the bit line 321 is pulled down by the storage cell 210 or 220, the bit line 321 is clamped to Vt less than the gate voltage of the cascode device (where Vt is the transistor gate threshold voltage) and the pull-down current is converted to an amplified voltage at the clamped output 324 that can be sensed at the load resistor 322.

When complementary bit lines 321 are used, variations in Vt between the cascode devices affect the clamped voltage on the bit line 321, but the amplified voltage is the product of the current on the complementary bit lines and the output resistance. The amplified voltage is only affected via the impedance of the complementary bit lines, i.e, the voltage of the bit line affects the bit line current.

While simple, the clamping circuit 325 may not provide adequate gain to hold the swing of the bit line 321 sufficiently low. Also, because the clamping circuit 325 is single-ended, the clamping circuit 325 does not clamp the bit line 321 properly when current is sourced onto the bit line 321 by the storage cell 210 or 220.

Figure 4:
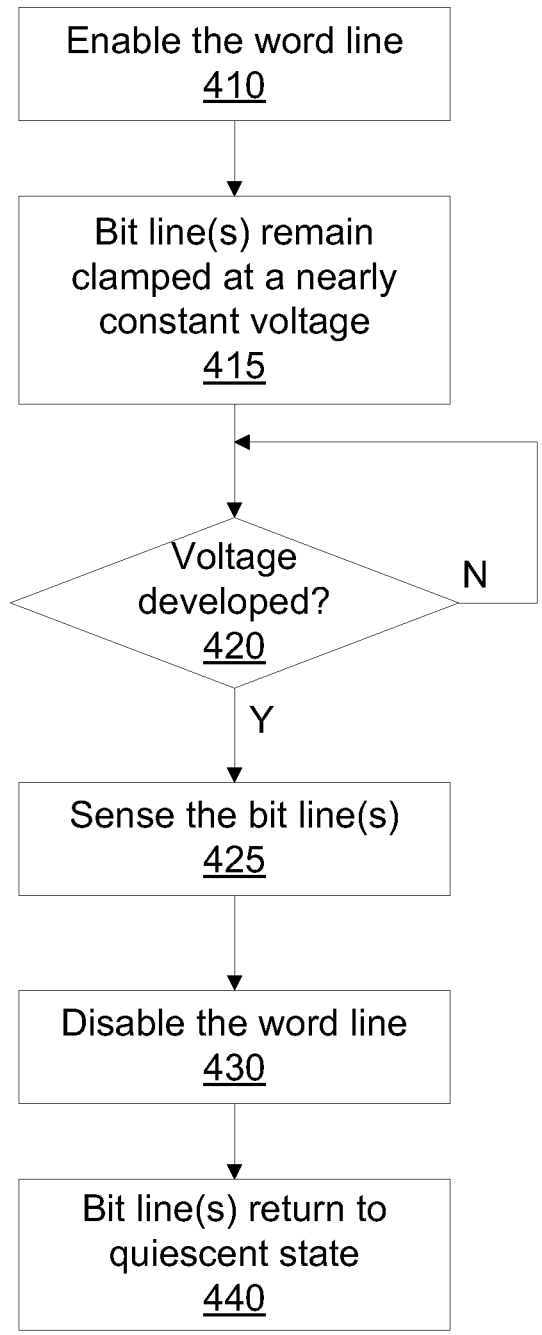
FIG. 4 illustrates a method of performing a read operation using a bit line read clamping circuit, in accordance with one or more aspects of the present invention.

FIG. 4 illustrates a method of performing a read operation using a bit line read clamping circuit 205, 305, or 315, in accordance with one or more aspects of the present invention. Although the method steps are described in conjunction with the systems of FIGS. 2A, 2B, 3A, and 3B, persons skilled in the art will understand that any system configured to perform the method steps, in any order, is within the scope of the invention.

At step 410 at least one word line is asserted to perform a read operation. At step 415, the bit lines remain clamped at a nearly constant clamp voltage Vc 212. At step 420 the method waits for a voltage to develop at the clamped output. As the bit lines to vary slightly from the nearly constant clamp voltage, the amplified voltage is generated at the clamped output. A single bit line will be pulled slightly high or low and complementary bit lines will be deviate from each other. At step 425 the voltage developed at the clamped output may be sensed. At step 430 the word line is disabled. In one embodiment, at step 425 the differential voltage between the bit line H and the bit line L may be sensed by the sense amplifier 238 to generate the output 240. In other embodiments, a send amplifier is not used and the bit line is sensed directly. At step 440 the bit lines return to the quiescent state, to the voltage level of the Vc 212.

Figure 5A:
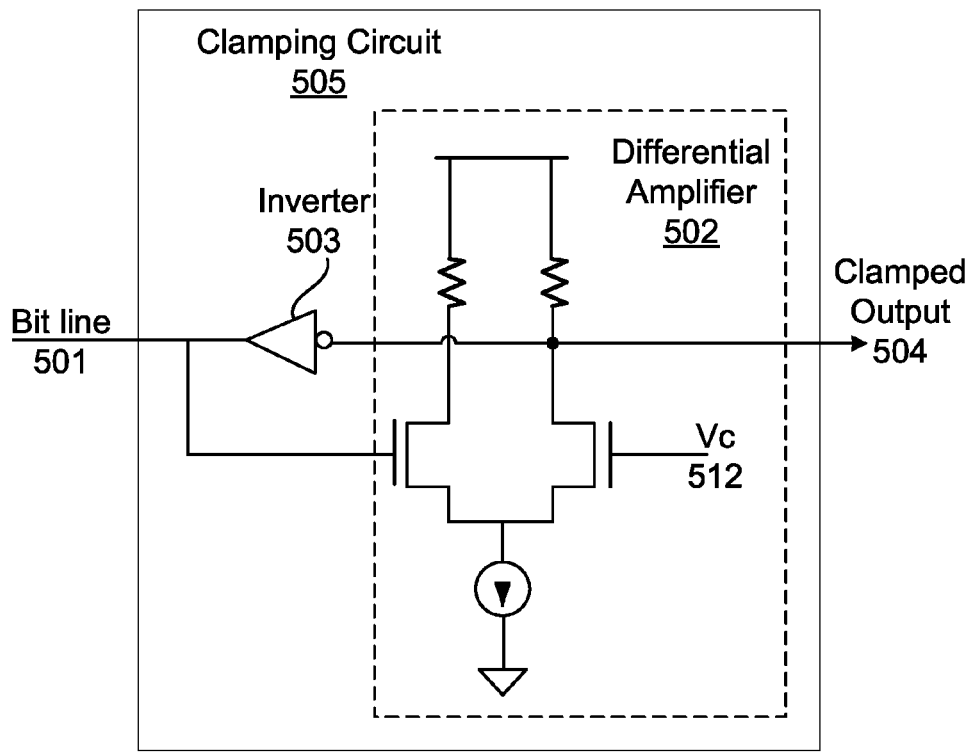
FIG. 5A illustrates a bit line read clamping circuit using a differential amplifier, according to one embodiment of the invention.

FIG. 5A illustrates a bit line read clamping circuit 505 using a differential amplifier, according to one embodiment of the invention. A differential amplifier 502 as shown in FIG. 5A may be used to increase the gain and reduce the voltage swing of the bit line 501. The differential amplifier 502 provides direct feedback as the current driver, so that a feedback resistor is not needed. As is also the case for the clamping circuits 305 and 315, a voltage offset of the differential amplifier 502 is cancelled by the feedback loop. Therefore, the voltage offset only results in an offset in the quiescent voltage of the bit line 501. To reduce power consumption, the current tail in the differential amplifier 502 and the feedback inverter 503 may be disabled when a read operation is not being performed.

Figure 5B:
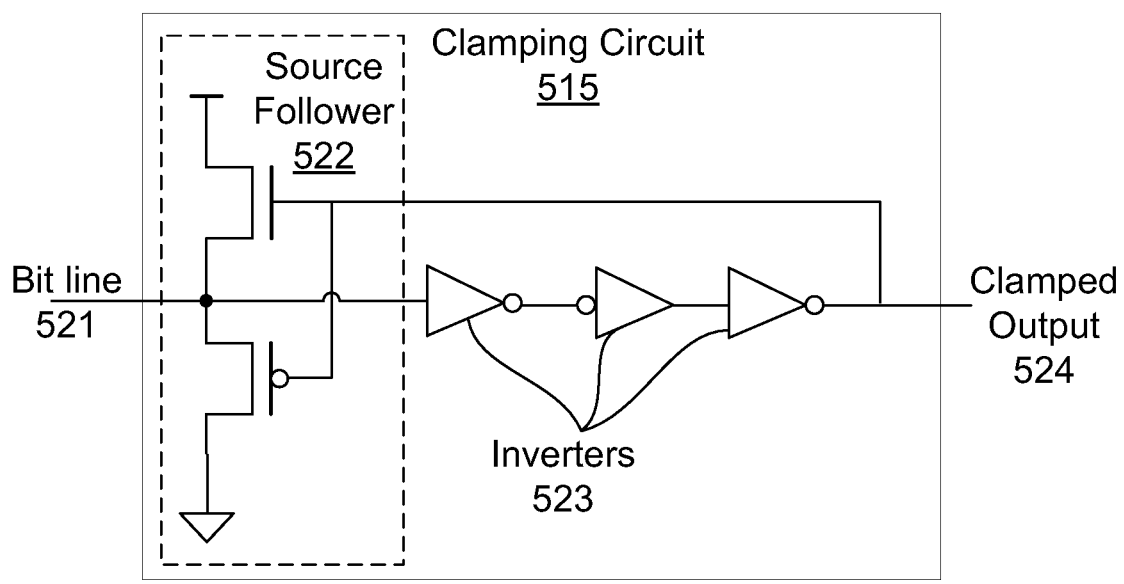
FIG. 5B illustrates a bit line read clamping circuit using a source follower to provide feedback, according to one embodiment of the invention.

FIG. 5B illustrates a bit line read clamping circuit 515 using a source follower 522 to provide feedback, according to one embodiment of the invention. The source follower 522 provides non-linear feedback so that the clamped output 524 does not fight the current on the bit line 521 until voltage level that may be sensed is achieved at the clamped output 524. As shown in FIG. 5B, the source follower 522 is coupled to three inverters 523 in series. However, a single inverter may replace inverters 523 or a differential amplifier 502 may replace inverters 523.

Figure 5C:
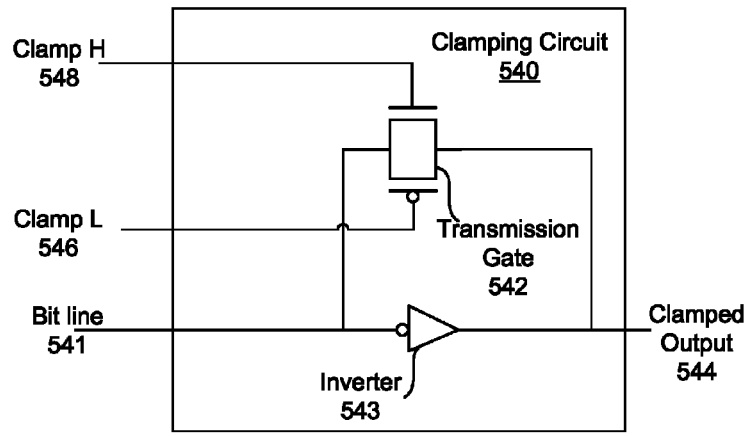
FIG. 5C illustrates a bit line read clamping circuit using a transmission gate to provide feedback and with a clamp signal, according to one embodiment of the invention.

FIG. 5C illustrates a bit line read clamping circuit 540 using a transmission gate 542 to provide feedback and with a complementary clamp signal, according to one embodiment of the invention. The clamp H 548 and clamp L 546 enable feedback around the inverter 543 to clamp the bit line 541. During a read operation, the clamp H 548 is asserted and the clamp L 546 is negated along with at least one word line. The clamp H 548 is asserted and the clamp L 546 is negated during an equalize operation when a read follows a write operation. The only time during which the clamp H 548 should not be asserted and the clamp L 546 should not be negated is during a write operation. As is the case with the clamping circuit 305, the inverter 543 functions as an amplifier to generate the clamped output 544 during read operations.

Figure 5D:
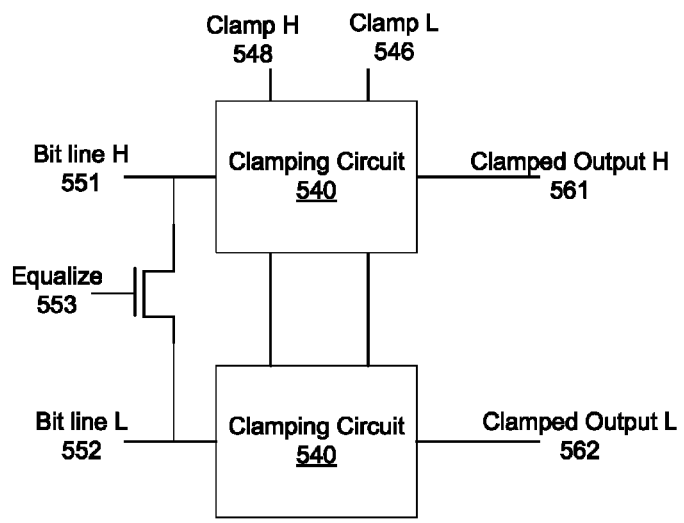
FIG. 5D illustrates a bit line read clamping circuit using a transmission gate to provide feedback and with an equalize signal and a clamp signal, according to one embodiment of the invention.

FIG. 5D illustrates two bit line read clamping circuits 540 with an equalize signal 533, according to one embodiment of the invention. The equalize operation causes the bit line H 551 and the bit line L 552 to be pulled together, i.e., equalized, and each set to the clamp voltage, Vc 212. The equalize 553 is asserted when a read follows a write operation to perform an equalize operation. The bit lines 551 and 552 do not need to be equalized between write operations or between read operations. The bit lines 551 and 552 also do not need to be equalized between when a write operation follows a read operation.

When a read operation is performed the clamping circuit 540 settles and the read data may be sensed at the clamped output H 561 and the clamped output L 562. A clocked or static sense amplifier may be used to sense the clamped output H 561 and the clamped output L 562.

Figure 5E:
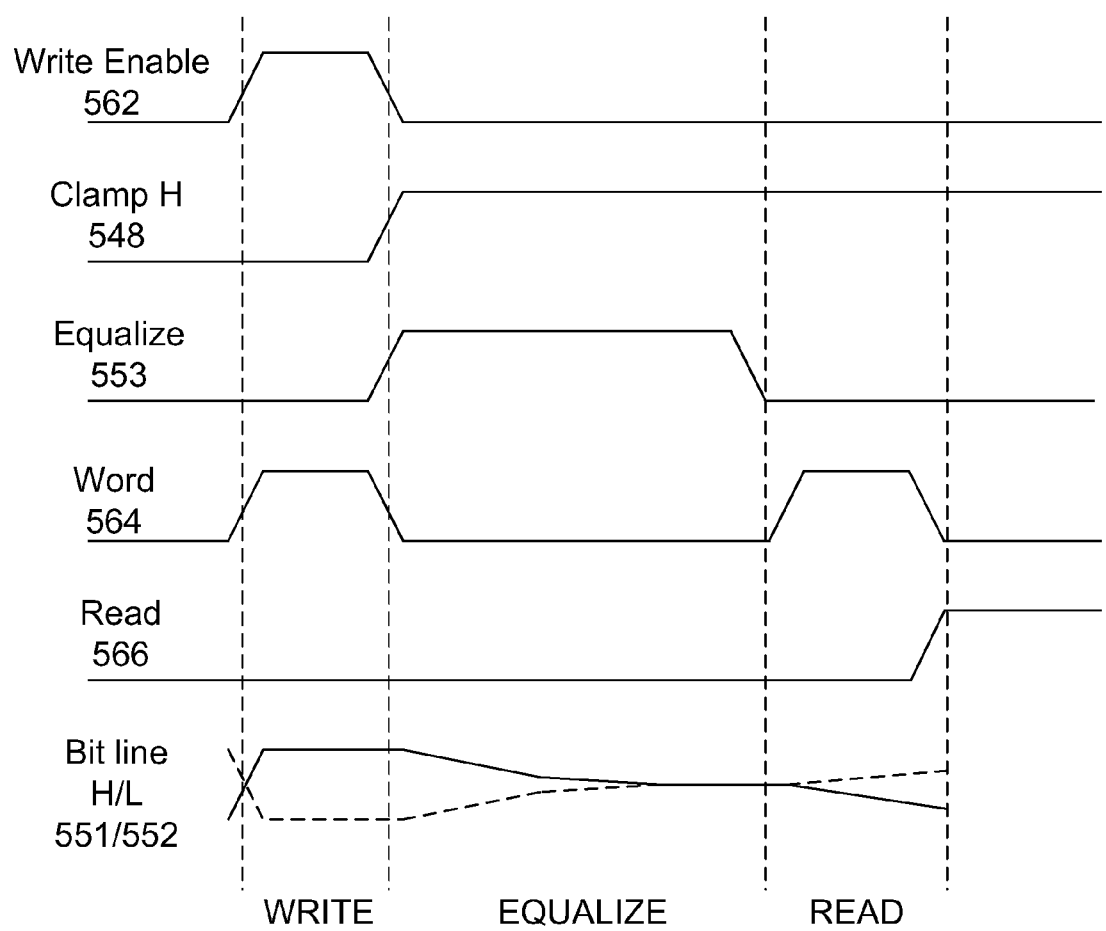
FIG. 5E illustrates a timing diagram showing a read operation that follows a write operation, according to one embodiment of the invention.

FIG. 5E illustrates a timing diagram showing a read operation that follows a write operation, according to one embodiment of the invention. A memory array using a clamped bit line read circuit may be configured to perform three types of operations—write, read, and equalize. To perform a write operation, the write enable 562 signal is asserted, causing a pair of tri-state drivers to drive the bit lines 551 and 552 to the power supply (VCC) and ground (GND), respectively, and the word line 564 is asserted—transferring the write data to the selected storage cell.

Write operations can be performed back-to-back, or after a read operation, and read operations can be performed back-to-back. However, an equalize operation must be performed after a sequence of one or more write operations before a read operation can be performed. During an equalize operation, the clamp signals 546 and 548 and equalize signal 553 are asserted to pull the bit lines 551 and 552 together and set them to the clamp voltage, Vc 212. As shown in FIG. 5E, the equalize signal 553 enables the NMOS transistor coupled between the bit lines 551 and 552 to equalize the bit lines 551 and 552. The clamp signals 546 and 548 enable strong feedback around the inverter 543, to force the bit lines 551 and 552 to the switching points of the inverters, $V_{inv}$ (also the clamp voltage Vc 212). In another embodiment, the transmission gate 542 includes weak devices and the transmission gate 542 is not turned off during the read operation, slowing the read operation.

To perform a read operation, the read signal 566 and the clamp H signal 548 is asserted and the clamp L signal 546 is negated, and, after allowing a voltage to develop at the clamped output 544, the value at the clamped output 544 of the clamping circuit 540 is sensed. The voltages of the bit lines 551 and 552 are amplified by the inverter 543 gain, typically around 5-10, and then the clamped output 544 may be sampled. In one embodiment, the memory array is a read-only array and the equalize signals 546 and 548 and the clamp signal 553 are not used.

System Overview

Figure 6:
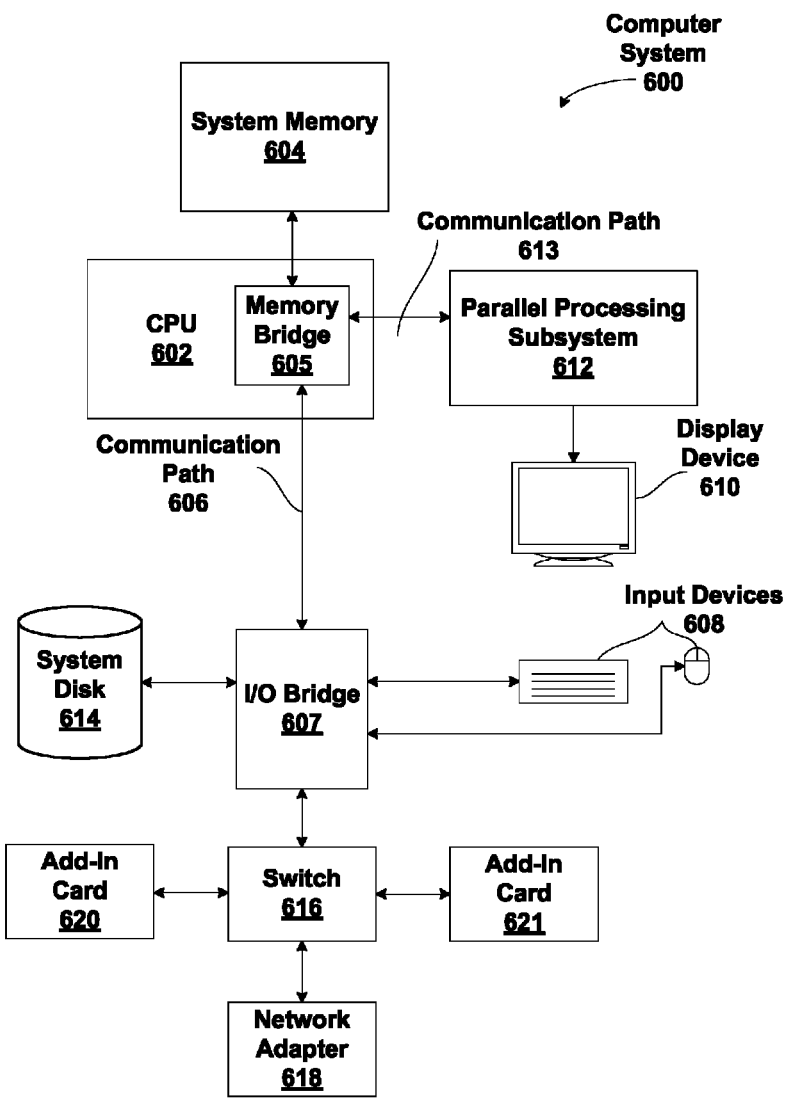
FIG. 6 is a block diagram illustrating a computer system configured to implement one or more aspects of the present invention.

FIG. 6 is a block diagram illustrating a computer system 100 configured to implement one or more aspects of the present invention. Computer system 600 includes a central processing unit (CPU) 602 and a system memory 604 communicating via a bus path through a memory bridge 605. Memory bridge 605 may be integrated into CPU 602 as shown in FIG. 6. Alternatively, memory bridge 605, may be a conventional device, e.g., a Northbridge chip, that is connected via a bus to CPU 602. Memory bridge 605 is connected via communication path 606 (e.g., a HyperTransport link) to an I/O (input/output) bridge 607. I/O bridge 607, which may be, e.g., a Southbridge chip, receives user input from one or more user input devices 608 (e.g., keyboard, mouse) and forwards the input to CPU 602 via path 606 and memory bridge 605. A parallel processing subsystem 612 is coupled to memory bridge 605 via a bus or other communication path 613 (e.g., a PCI Express, Accelerated Graphics Port, or HyperTransport link); in one embodiment parallel processing subsystem 612 is a graphics subsystem that delivers pixels to a display device 610 (e.g., a conventional CRT or LCD based monitor). A system disk 614 is also connected to I/O bridge 607. A switch 616 provides connections between I/O bridge 607 and other components such as a network adapter 618 and various add-in cards 620 and 621. Other components (not explicitly shown), including USB or other port connections, CD drives, DVD drives, film recording devices, and the like, may also be connected to I/O bridge 607. Communication paths interconnecting the various components in FIG. 6 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 612 incorporates circuitry optimized for graphics and video processing, including, for example, video output circuitry, and constitutes a graphics processing unit (GPU). In another embodiment, the parallel processing subsystem 612 incorporates circuitry optimized for general purpose processing, while preserving the underlying computational architecture, described in greater detail herein. In yet another embodiment, the parallel processing subsystem 612 may be integrated with one or more other system elements, such as the memory bridge 605, CPU 602, and I/O bridge 607 to from a system on chip (SoC). One or more of CPU 602, parallel processing sub-system 612, system memory 604, I/O bridge 607, and switch 616 may include a clamped bit line read circuit, such as clamping circuits 205, 305, 315, 505, 515, and 540.

It will be appreciated that the system shown herein is illustrative and that variations and modifications are possible. The connection topology, including the number and arrangement of bridges, may be modified as desired. For instance, in some embodiments, system memory 604 is connected to CPU 602 directly rather than through a bridge, and other devices communicate with system memory 604 via memory bridge 605 and CPU 602. In other alternative topologies, parallel processing subsystem 612 is connected to I/O bridge 607 or directly to CPU 602, rather than to memory bridge 605. In still other embodiments, one or more of CPU 602, I/O bridge 607, parallel processing subsystem 612, and memory bridge 605 may be integrated into one or more chips. The particular components shown herein are optional; for instance, any number of add-in cards or peripheral devices might be supported. In some embodiments, switch 616 is eliminated, and network adapter 618 and add-in cards 620, 621 connect directly to I/O bridge 607.

In sum, the clamping circuit is used to maintain a bit line of a storage cell in a memory array at a nearly constant clamp voltage. During read operations the bit line or complementary bit lines vary from the constant clamp voltage and the change in current on the bit line or complementary bit lines is converted by the clamping circuit to produce an amplified voltage that may be sampled to complete the read operation. The clamping circuit maintains the nearly constant clamp voltage on each bit line by providing a feedback path between the bit line and the amplified voltage. Clamping the bit line to the nearly constant clamp voltage reduces the occurrence of read disturb faults. Additionally, the clamping circuit functions with a variety of storage cells and does not require that the bit lines be precharged prior to each read operation.

One advantage of the disclosed circuit is that the bit lines do not need to be precharged prior to each read operation. Therefore, the dynamic power dissipation is reduced significantly compared with memory arrays using storage cells that need to be precharged prior to each read operation. The clamping circuit reduces read faults so that sizing dependencies between the different transistors of the storage cells may be relaxed. Therefore, read operations are robust, even when the characteristics of the transistors vary due to the fabrication process.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A memory array, comprising:
    a bit line;
    a storage cell that coupled to the bit line and is read when a word line is enabled; and
    a clamping circuit coupled to the bit line and configured to hold the bit line at a nearly constant clamp voltage during a read operation, wherein the nearly constant clamp voltage varies by less than 50 millivolts during the read operation.

2. The memory array of claim 1, wherein the nearly constant clamp voltage is maintained through a feedback sub-circuit.

3. The memory array of claim 1, wherein the nearly constant clamp voltage is maintained through a resistor that is coupled between the bit line and an output of an inverter having an input coupled to the bit line.

4. The memory array of claim 3, wherein the resistor comprises a pass gate.

5. The memory array of claim 4, wherein the pass gate is disabled during a write operation.

6. A memory array, comprising:
    a bit line;
    a storage cell that coupled to the bit line and is read when a word line is enabled; and
    a clamping circuit coupled to the bit line and configured to hold the bit line at a nearly constant clamp voltage during a read operation wherein the nearly constant clamp voltage is maintained through multiple inverters that are coupled in series between the bit line and first terminal of a resistor, wherein an opposing terminal of the resistor is coupled to the bit line.

7. The memory array of claim 1, further comprising a complementary bit line that is coupled to the storage cell.

8. The memory array of claim 7, further comprising a transistor that is coupled between the bit line and the complementary bit line and configured to equalize voltages on the bit line and the complementary bit line.

9. The memory array of claim 1, wherein the storage circuit comprises only six transistors.

10. The memory array of claim 1, wherein the storage circuit comprises only eight transistors.

11. The memory array of claim 1, wherein the nearly constant clamp voltage is a threshold voltage of an inverter.

12. The memory array of claim 1, wherein an output voltage is developed by the clamping circuit in response to a current on the bit line.

13. The memory array of claim 1, wherein the nearly constant clamp voltage equals half of a supply voltage provided to the clamping circuit.

14. A method of reading a bit line of a memory array, comprising:
    enabling a word line to perform a read operation of a storage cell;
    amplifying a change in current developed on a bit line that is coupled to the storage cell while the word line is enabled and while the bit line is held to a nearly constant clamp voltage by a clamping circuit, wherein the nearly constant clamp voltage varies by less than 50 millivolts during the read operation; and
    sampling an amplified voltage generated by the clamping circuit.

15. The method of claim 14, wherein the nearly constant clamp voltage is maintained through a feedback sub-circuit.

16. The method of claim 14, wherein the nearly constant clamp voltage is maintained through a resistor that is coupled between the bit line and an output of an inverter having an input coupled to the bit line.

17. The method of claim 16, wherein the resistor comprises a pass gate.

18. The method of claim 17, further comprising disabling the pass gate during a write operation.

19. A method of reading a bit line of a memory array, comprising:
    enabling a word line to perform a read operation of a storage cell;
    amplifying a change in current developed on a bit line that is coupled to the storage cell while the word line is enabled and while the bit line is held to a nearly constant clamp voltage by a clamping circuit, wherein the nearly constant clamp voltage is maintained through multiple inverters that are coupled in series between the bit line and first terminal of a resistor, wherein an opposing terminal of the resistor is coupled to the bit line; and sampling an amplified voltage generated by the clamping circuit.

20. The method array of claim 14, further comprising:

amplifying a change in current developed on a complementary bit line that is coupled to the storage cell while the word line is enabled and while the complementary bit line is held to the nearly constant clamp voltage by an additional clamping circuit, wherein the additional clamping circuit generates a complementary amplified voltage;

sampling a voltage difference between the amplified voltage generated by the clamping circuit and the complementary amplified voltage; and clamping the complementary bit line to the nearly constant clamp voltage.

21. The method of claim 20, further comprising equalizing voltages between the bit line and the complementary bit line.

* * * * *